(12) United States Patent
Basker et al.

(10) Patent No.: US 9,318,384 B2
(45) Date of Patent: Apr. 19, 2016

(54) DIELECTRIC LINER FOR A SELF-ALIGNED CONTACT VIA STRUCTURE

(71) Applicant: International Business Machines Corporation, Armonk, NY (US)

(72) Inventors: Veeraraghavan S. Basker, Schenectady, NY (US); Kangguo Cheng, Schenectady, NY (US); Ali Khakifirooz, Mountain View, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 19 days.

(21) Appl. No.: 14/223,282

(22) Filed: Mar. 24, 2014

(65) Prior Publication Data

US 2015/0270171 A1 Sep. 24, 2015

(51) Int. Cl.
| | |
|---|---|
| *H01L 29/417* | (2006.01) |
| *H01L 29/06* | (2006.01) |
| *H01L 29/66* | (2006.01) |
| *H01L 21/768* | (2006.01) |
| *H01L 29/78* | (2006.01) |

(52) U.S. Cl.
CPC ...... *H01L 21/76897* (2013.01); *H01L 29/0642* (2013.01); *H01L 29/4175* (2013.01); *H01L 29/41783* (2013.01); *H01L 29/66628* (2013.01); *H01L 29/78* (2013.01); *H01L 29/6656* (2013.01); *H01L 29/66545* (2013.01)

(58) Field of Classification Search
None
See application file for complete search history.

(56) References Cited

U.S. PATENT DOCUMENTS

| | | | |
|---|---|---|---|
| 8,288,296 B2 | 10/2012 | Wong et al. | |
| 2004/0203211 A1* | 10/2004 | Yang | H01L 21/76897 438/299 |
| 2009/0096003 A1* | 4/2009 | Zhu | H01L 27/1082 257/309 |
| 2010/0252800 A1 | 10/2010 | Chidambarrao et al. | |
| 2011/0175152 A1* | 7/2011 | Booth, Jr. | H01L 21/845 257/306 |
| 2012/0088342 A1 | 4/2012 | Ming et al. | |
| 2012/0261756 A1 | 10/2012 | Kanike et al. | |
| 2013/0020658 A1* | 1/2013 | Guo | H01L 29/4958 257/412 |
| 2013/0221447 A1* | 8/2013 | Lee | H01L 27/092 257/369 |
| 2014/0183633 A1* | 7/2014 | Chen | H01L 29/7855 257/347 |
| 2015/0287723 A1* | 10/2015 | Lii | H01L 21/28518 257/369 |

FOREIGN PATENT DOCUMENTS

EP 1908103 B1 1/2011

OTHER PUBLICATIONS

U.S. Office Action dated Sep. 29, 2015 received in U.S. Appl. No. 14/510,606.

* cited by examiner

*Primary Examiner* — Khaja Ahmad
(74) *Attorney, Agent, or Firm* — Scully, Scott, Murphy & Presser, P.C.; Steven J. Meyers

(57) ABSTRACT

At least one dielectric material layer having a top surface above the topmost surface of the gate electrode of a field effect transistor is formed. Active region contact via structures are formed through the at least one dielectric material layer to the source region and the drain region. A self-aligned gate contact cavity is formed over the gate electrode such that at least one sidewall of the gate contact cavity is a sidewall of the active region contact via structures. A dielectric spacer is formed at the periphery of the gate contact cavity by deposition of a dielectric liner and an anisotropic etch. A conductive material is deposited in the gate contact cavity and planarized to form a self-aligned gate contact via structure that is electrically isolated from the active region contact via structures by the dielectric spacer.

15 Claims, 16 Drawing Sheets

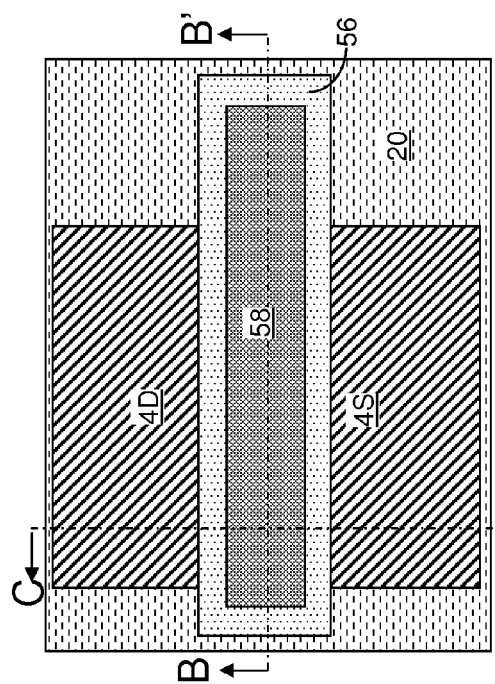
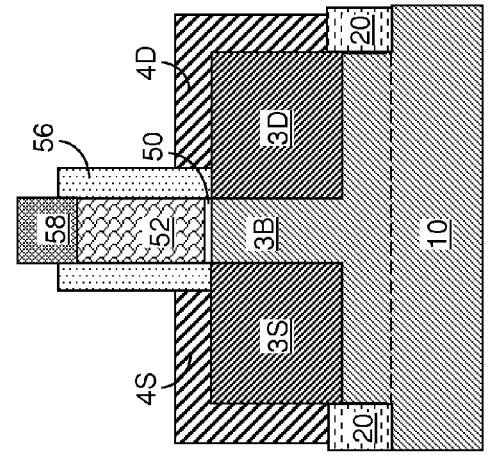
FIG. 4A
FIG. 4B
FIG. 4C

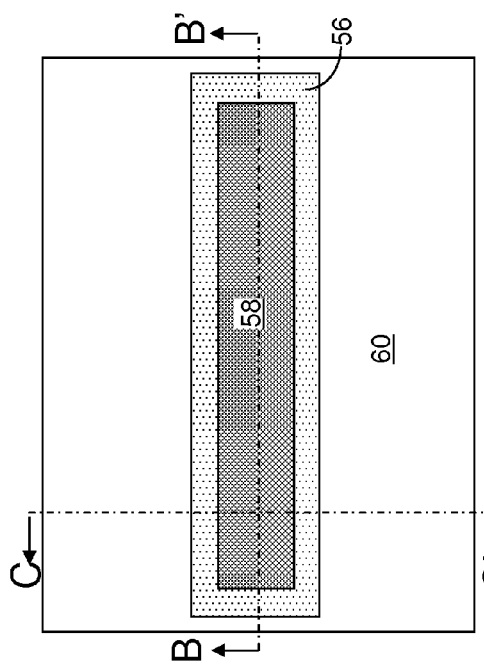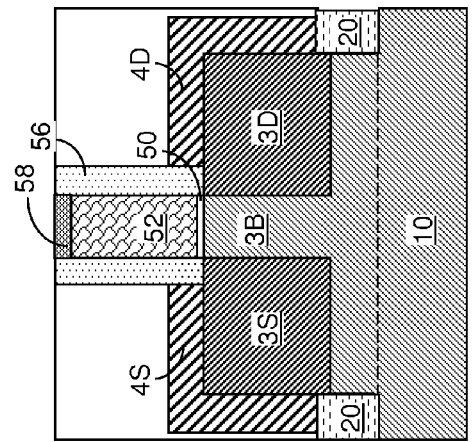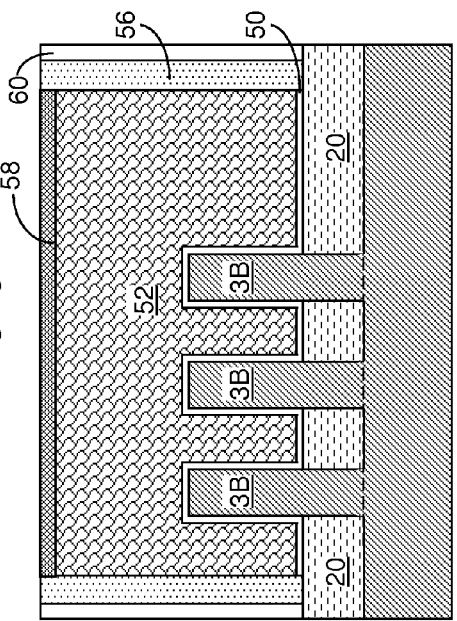

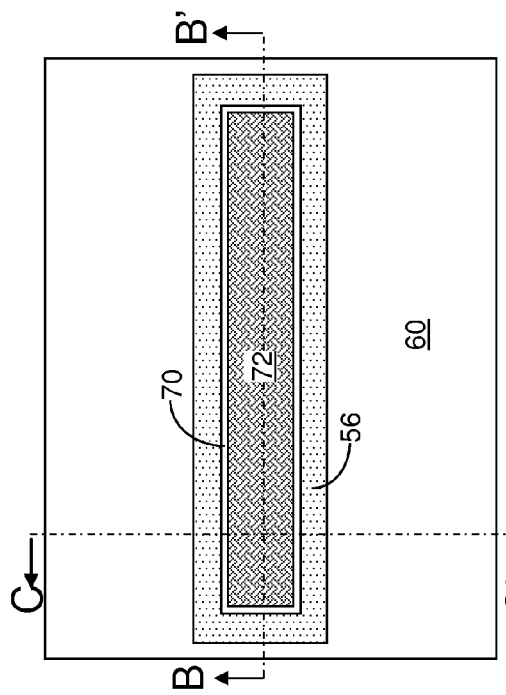
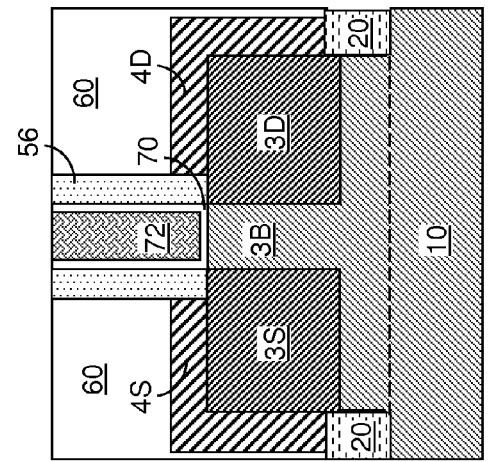
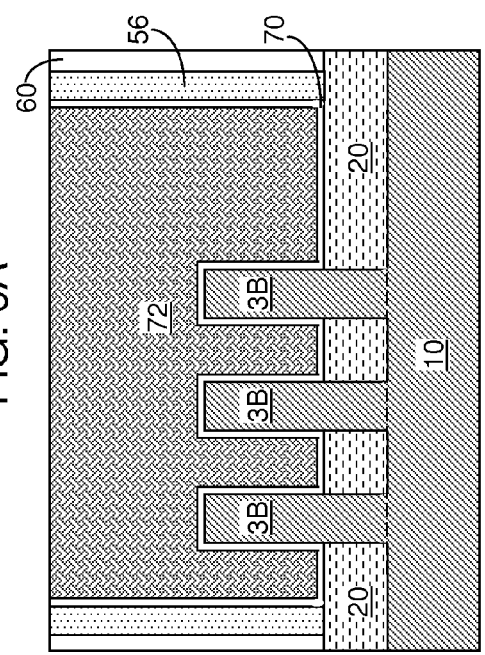
FIG. 6A
FIG. 6B
FIG. 6C

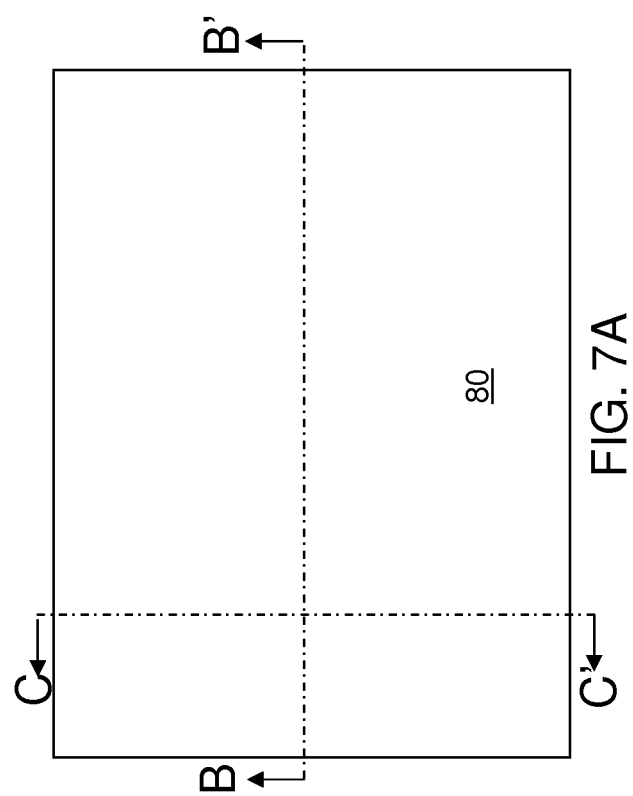

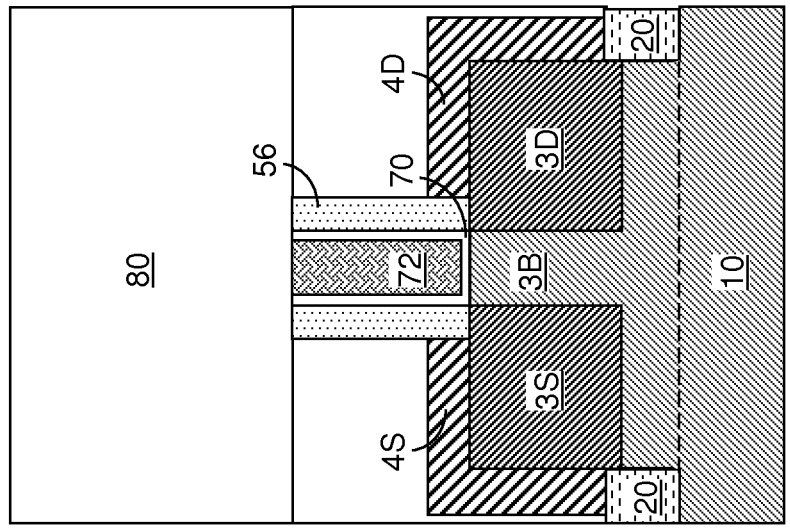
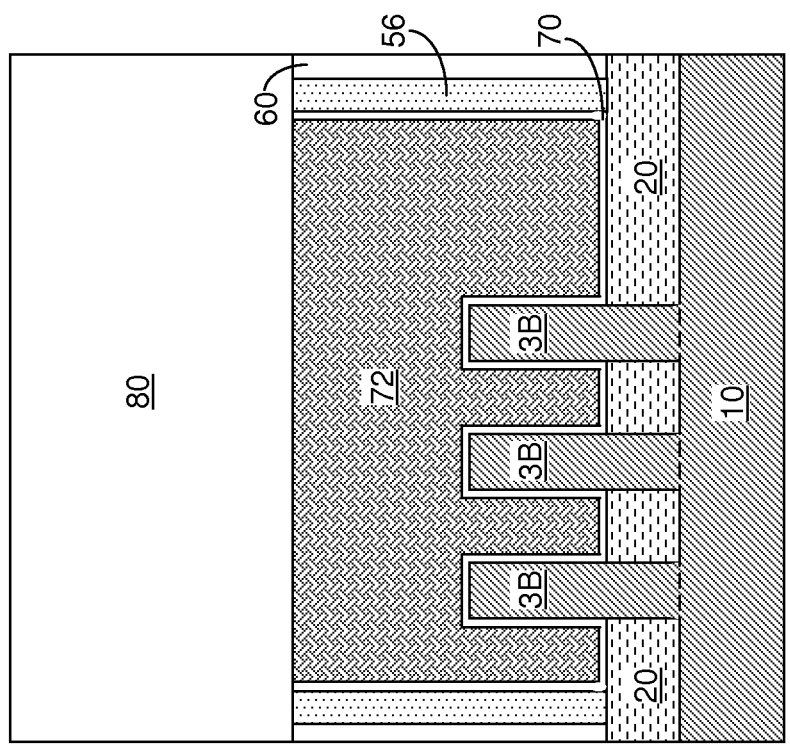

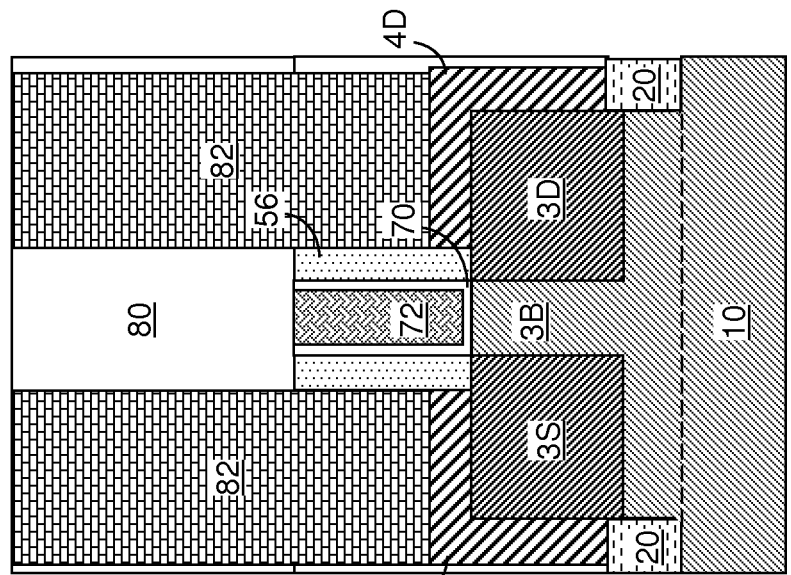
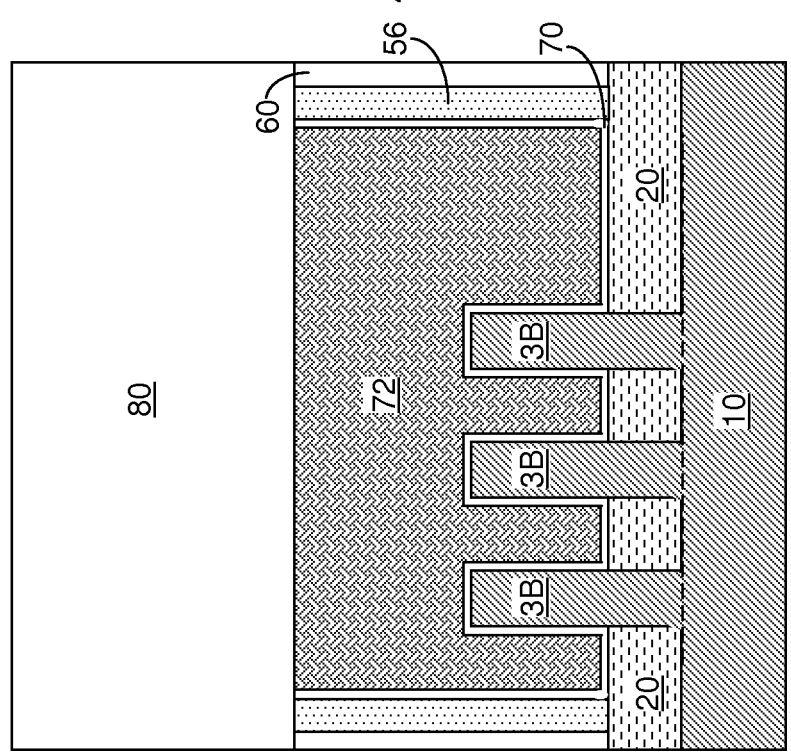

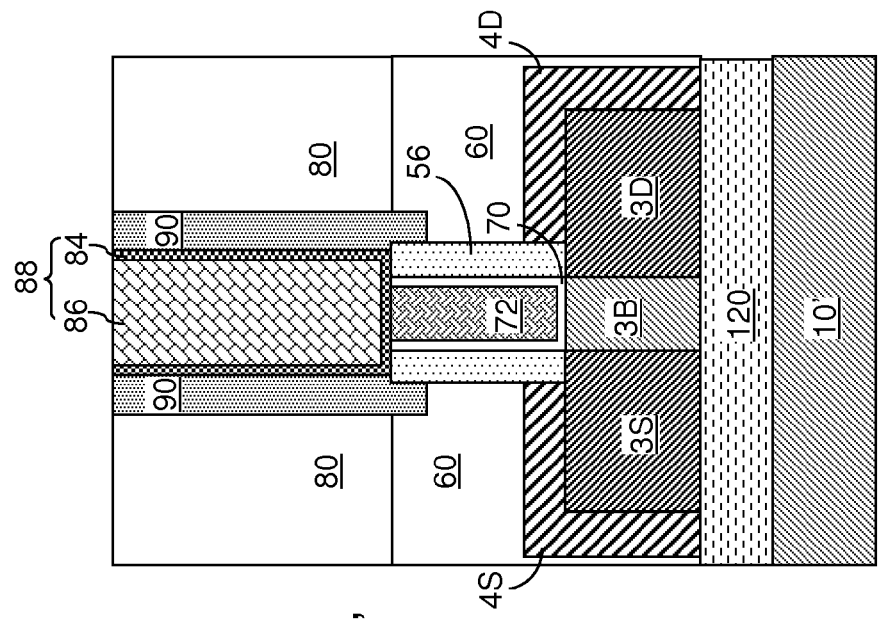
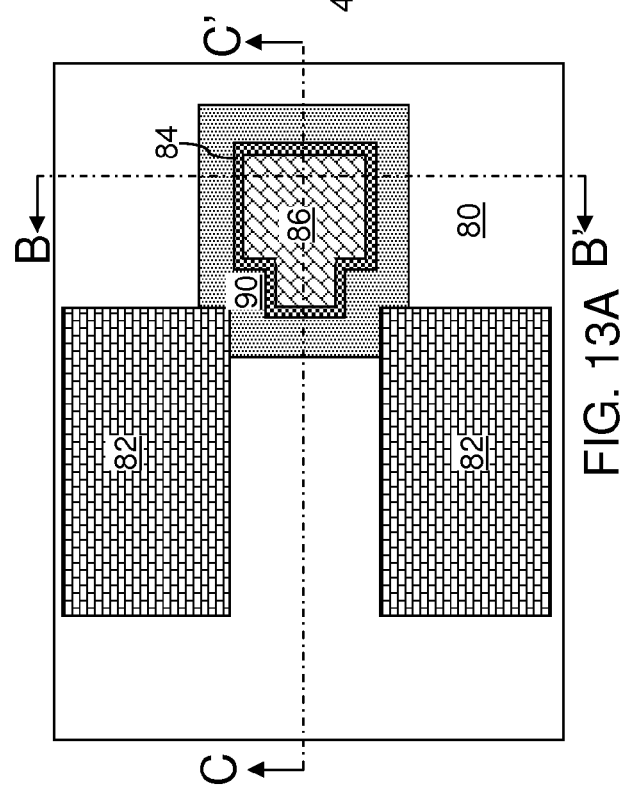
FIG. 13A
FIG. 13B

DIELECTRIC LINER FOR A SELF-ALIGNED CONTACT VIA STRUCTURE

BACKGROUND

The present disclosure relates to a semiconductor structure, and particularly to a semiconductor structure including a dielectric liner laterally surrounding a self-aligned contact via structure and a method for manufacturing the same.

As the dimensions of semiconductor devices shrink, reliable formation of contact via structures without electrical short to adjacent conductive structures has become more and more difficult due to limitations in the overlay control in lithographic processes. One of the more challenging processes is the formation of contact via structures to field effect transistors. Particularly, formation of contact via structures on a field effect transistor requires formation of active region contact via structures that include a source contact via structure and a drain contact via structure, and formation of a gate contact via structure. Because the source region and the drain region are laterally spaced from the gate electrode only by a gate spacer, the gate contact via structure is prone to electrical short to the source contact via structure and/or the drain contact via structure. A method of providing electrical isolation between a gate contact via structure and active region contact via structures is desired in order to reliably manufacture a field effect transistor that is free from electrical short between a gate electrode and source and drain regions.

SUMMARY

A field effect transistor including a source region, a drain region, and a gate electrode is formed on a substrate. At least one dielectric material layer is formed such that the top surface of the at least one dielectric material layer is located above the topmost surface of the gate electrode. Active region contact via structures are formed through the at least one dielectric material layer to the source region and the drain region. A self-aligned gate contact cavity is formed over the gate electrode such that at least one sidewall of the gate contact cavity is a sidewall of the active region contact via structures. A dielectric spacer is formed at the periphery of the gate contact cavity by deposition of a dielectric liner and an anisotropic etch. A conductive material is deposited in the gate contact cavity and planarized to form a self-aligned gate contact via structure that is electrically isolated from the active region contact via structures by the dielectric spacer.

According to an aspect of the present disclosure, a semiconductor structure includes a semiconductor material portion including a doped semiconductor region and located on a substrate, a conductive material portion located above, and electrically insulated from, the semiconductor material portion, at least one dielectric material layer overlying the semiconductor material portion and the conductive material portion, and a first contact via structure extending through, and contacting, the at least one dielectric material layer and electrically shorted to the doped semiconductor region. The semiconductor structure further includes a second contact via structure extending through the at least one dielectric material layer and electrically shorted to the conductive material portion, and a dielectric spacer laterally surrounding the second contact via structure. Inner sidewalls of the dielectric spacer contact all sidewalls of the second contact via structure.

According to another aspect of the present disclosure, a method of forming a semiconductor structure is provided. A semiconductor material portion including a doped semiconductor region is formed on a substrate. A conductive material portion is formed above the semiconductor material portion. At least one dielectric material layer is formed over the semiconductor material portion. A first contact via structure is formed through the at least one dielectric material layer. The first contact via structure is electrically shorted to the doped semiconductor region. A cavity overlying the conductive material portion is formed through the at least one dielectric material layer. A dielectric spacer is formed on sidewalls of the cavity. A second contact via structure is formed in the cavity and directly on the conductive material portion.

BRIEF DESCRIPTION OF SEVERAL VIEWS OF THE DRAWINGS

FIG. 4A is a top-down view of the exemplary semiconductor structure after formation of raised active regions and fin active regions according to an embodiment of the present disclosure.

FIG. 4B is a vertical cross-sectional view of the exemplary structure along the vertical plane B-B' in FIG. 4A.

FIG. 4C is a vertical cross-sectional view of the exemplary structure along the vertical plane C-C' in FIG. 4A.

FIG. 5A is a top-down view of the exemplary semiconductor structure after deposition and planarization of a planarization dielectric layer according to an embodiment of the present disclosure.

FIG. 5B is a vertical cross-sectional view of the exemplary structure along the vertical plane B-B' in FIG. 5A.

FIG. 5C is a vertical cross-sectional view of the exemplary structure along the vertical plane C-C' in FIG. 5A.

FIG. 6A is a top-down view of the exemplary semiconductor structure after formation a replacement gate structure according to an embodiment of the present disclosure.

FIG. 6B is a vertical cross-sectional view of the exemplary structure along the vertical plane B-B' in FIG. 6A.

FIG. 6C is a vertical cross-sectional view of the exemplary structure along the vertical plane C-C' in FIG. 6A.

FIG. 7A is a top-down view of the exemplary semiconductor structure after formation of a contact level dielectric layer according to an embodiment of the present disclosure.

FIG. 7B is a vertical cross-sectional view of the exemplary structure along the vertical plane B-B' in FIG. 7A.

FIG. 7C is a vertical cross-sectional view of the exemplary structure along the vertical plane C-C' in FIG. 7A.

FIG. 8B is a vertical cross-sectional view of the exemplary structure along the vertical plane B-B' in FIG. 8A.

FIG. 8C is a vertical cross-sectional view of the exemplary structure along the vertical plane C-C' in FIG. 8A.

FIG. 13A is a top-down view of a variation of the exemplary semiconductor structure according to an embodiment of the present disclosure.

FIG. 13B is a vertical cross-sectional view of the variation of the exemplary structure along the vertical plane B-B' in FIG. 13A.

DETAILED DESCRIPTION

Figure 1A:
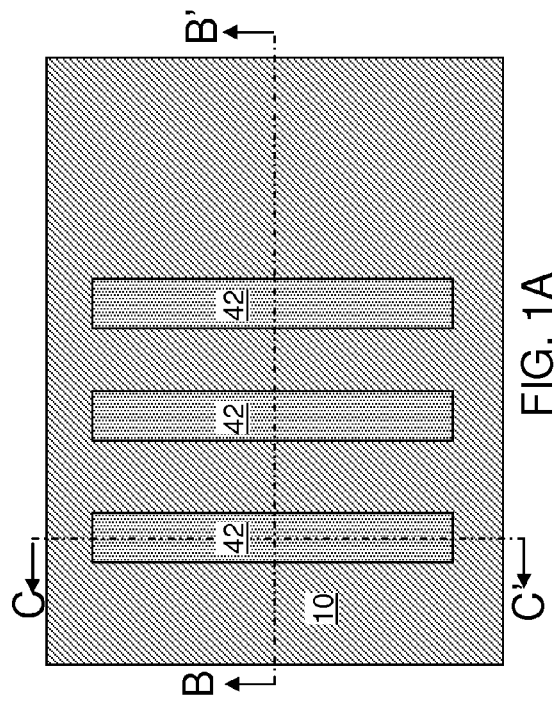
FIG. 1A is a top-down view of an exemplary semiconductor structure after formation of semiconductor fins according to an embodiment of the present disclosure.

As stated above, the present disclosure relates to a semiconductor structure including a dielectric liner laterally surrounding a self-aligned contact via structure and a method for manufacturing the same. Aspects of the present disclosure are now described in detail with accompanying figures. It is noted that like reference numerals refer to like elements across different embodiments. The drawings are not necessarily drawn to scale. As used herein, ordinals such as "first" and "second" are employed merely to distinguish similar elements, and different ordinals may be employed to designate a same element in the specification and/or claims.

Figure 1C:
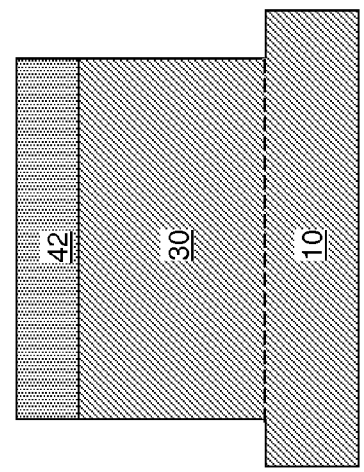
FIG. 1C is a vertical cross-sectional view of the exemplary structure along the vertical plane C-C' in FIG. 1A.
Figure 1B:
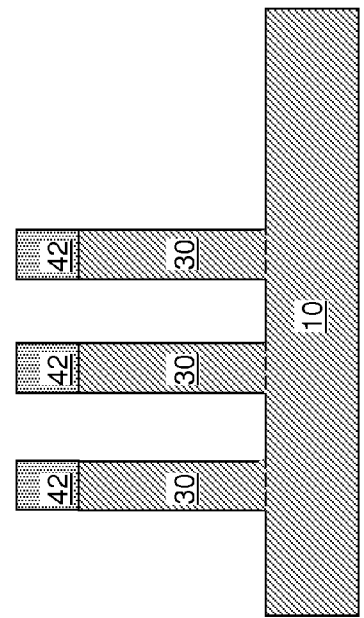
FIG. 1B is a vertical cross-sectional view of the exemplary structure along the vertical plane B-B' in FIG. 1A.

Referring to FIGS. 1A-1C, an exemplary semiconductor structure according to an embodiment of the present disclosure can be formed by providing a semiconductor substrate, which can be a bulk semiconductor substrate or a semiconductor-on-insulator (SOI) substrate. At least an upper portion of the semiconductor substrate includes a semiconductor material, which can be selected from elemental semiconductor materials (e.g., silicon, germanium, carbon, or alloys thereof), III-V semiconductor materials, or II-VI semiconductor materials. In one embodiment, the semiconductor substrate can include a single crystalline semiconductor material.

The upper portion of the semiconductor substrate can be patterned, by a combination of lithographic methods and an anisotropic etch, to form at least one semiconductor region, i.e., a region including a semiconductor material. The at least one semiconductor region can be at least one semiconductor fin 30. In one embodiment, the at least one semiconductor region can be at least one doped semiconductor region. In one embodiment, the at least one semiconductor fin 30 can be formed by patterning a top semiconductor layer of a semiconductor-on-insulator (SOI) substrate including the top semiconductor layer, a buried insulator layer, and a handle substrate. A stack of the buried insulator layer and the handle substrate collectively constitute a substrate on which the at least one semiconductor fin 30 is present. In another embodiment, the at least one semiconductor fin 30 can be formed by patterning an upper portion of a bulk semiconductor substrate. The remaining unpatterned portion of the bulk semiconductor substrate that underlies the at least one semiconductor fin is a semiconductor material layer 10, which constitutes a substrate mechanically supporting the at least one semiconductor fin 30.

As used herein, a "semiconductor fin" refers to a semiconductor material portion having a pair of parallel vertical sidewalls that are laterally spaced by a uniform dimension. In one embodiment, each semiconductor fin can have a rectangular horizontal cross-sectional area such that the spacing between the pair of parallel vertical sidewalls is the same as the length of shorter sides of the shape of the rectangular horizontal cross-sectional area. As used herein, a "fin field effect transistor" refers to a field effect transistor in which at least a channel region is located within a semiconductor fin.

For example, a photoresist layer (not shown) can be applied over the top surface of the semiconductor substrate and lithographically patterned to mask portions of the semiconductor substrate in which the at least one semiconductor fin 30 is subsequently formed. Optionally, a dielectric material layer may be provided between the semiconductor substrate and the photoresist layer. The pattern in the photoresist layer can be transferred through the dielectric material layer, if present, and into the upper portion of the semiconductor substrate. The at least one remaining patterned portion of the semiconductor substrate constitutes the at least one semiconductor fin 30. If the dielectric material layer is present between the semiconductor substrate and the patterned photoresist layer, each remaining portion of the dielectric material layer constitutes a dielectric fin cap 42, which has the same horizontal cross-sectional shape as the underlying semiconductor fin 30.

If the semiconductor substrate is a bulk substrate, the remaining portion of the semiconductor substrate underlying the at least one semiconductor fin 30 is the semiconductor material layer 10. In this case, the semiconductor material layer 10 is a substrate on which the at least one semiconductor fin 30 are formed. The semiconductor material layer 10 functions as a substrate mechanically supporting the at least one semiconductor fin 30. The at least one semiconductor fin 30 and the semiconductor material layer 10 collectively constitute a contiguous semiconductor material portion. In one embodiment, the entirety of the contiguous semiconductor material portion can be single crystalline. Alternatively, if the semiconductor substrate is a semiconductor-on-insulator (SOI) substrate, a vertical stack of a buried insulator layer and a handle substrate layer can be present underneath the at least one semiconductor fin 30 in lieu of the semiconductor material layer 10. In this case, the vertical stack of the buried insulator layer and the handle substrate layer is a substrate on which the at least one semiconductor fin 30 are formed.

The height of the at least one semiconductor fin 30 can be from 5 nm to 1,000 nm, although lesser and greater heights can also be employed. The at least one semiconductor fin 30 and the semiconductor material layer 10 can be doped with electrical dopants, i.e., p-type dopants or n-type dopants. As used herein, an electrical dopant refers to a dopant that introduces an extra charge to the lattice of the semiconductor material into which the electrical dopant is introduced. The at least one semiconductor fin 30 and the semiconductor material layer 10 can have a same type of doping, which is herein referred to as a first conductivity type.

Each semiconductor fin 30 is laterally bound by a pair of lengthwise sidewalls and a pair of widthwise sidewalls. As used herein, a "lengthwise direction" of an element refers to a direction that is parallel to the axis which passes through the center of mass of the element and about which the moment of inertia of the element becomes a minimum. As used herein, a "lengthwise sidewall" of an element refers to a sidewall of an element that extends along the lengthwise direction of the element. As used herein, a "widthwise sidewall" of an element refers to a sidewall of the element that extends along a horizontal direction that is perpendicular to the lengthwise direction of the element. In one embodiment, each of the at least one semiconductor fin 30 can have a rectangular horizontal cross-sectional shape.

In one embodiment, lengthwise sidewalls of a semiconductor fin 30 can be within a pair of vertical planes laterally spaced from each other by the width of the semiconductor fin 30. In one embodiment, the at least one semiconductor fin 30 can be within a plurality of semiconductor fins laterally spaced from one another along the widthwise direction of the at least one semiconductor fin 30.

Figure 2C:
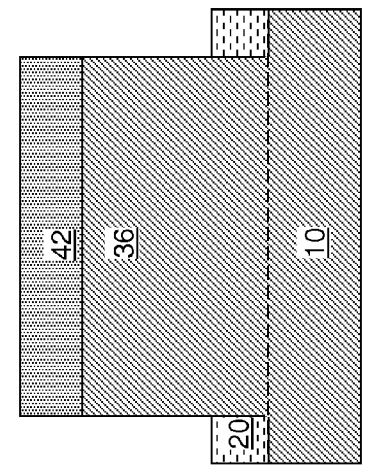
FIG. 2C is a vertical cross-sectional view of the exemplary structure along the vertical plane C-C' in FIG. 2A.
Figure 2A:
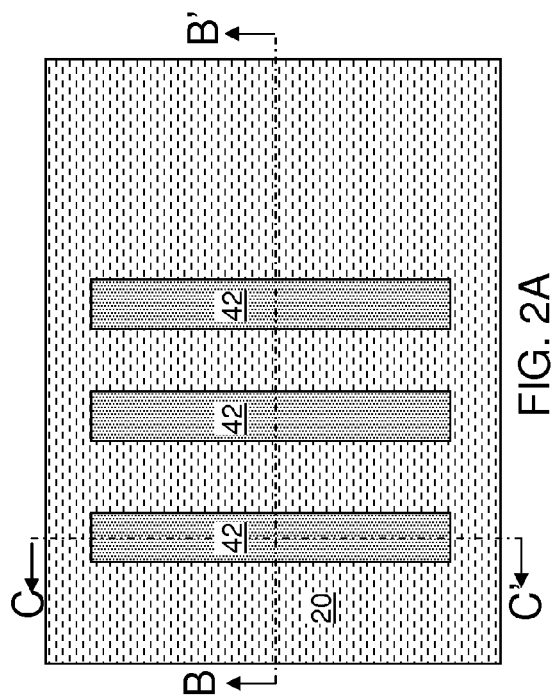
FIG. 2A is a top-down view of the exemplary semiconductor structure after formation of a shallow trench isolation layer according to an embodiment of the present disclosure.
Figure 2B:
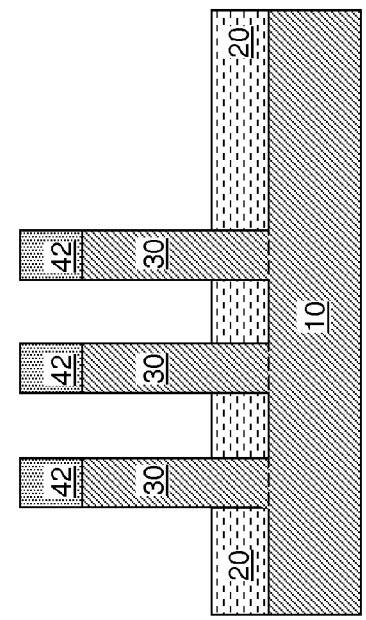
FIG. 2B is a vertical cross-sectional view of the exemplary structure along the vertical plane B-B' in FIG. 2A.

Referring to FIGS. 2A-2C, a shallow trench isolation layer 20 can be formed around bottom portions of the at least one semiconductor fin 30. The shallow trench isolation layer 20 includes a dielectric material such as silicon oxide. The shallow trench isolation layer 20 can be formed by depositing a self-planarizing dielectric material over the semiconductor material layer 10 and around the bottom portion of each semiconductor fin 30. The deposition of the dielectric material can be performed, for example, by chemical vapor deposition or a self-planarizing deposition process such as spin coating. If the deposition process is not self-planarizing, excess portions of the deposited dielectric material can be removed from above the top surfaces of the at least one semiconductor fin 30, for example, by planarization (such as chemical mechanical planarization (CMP)). The shallow trench isolation layer 20 laterally surrounds the at least one semiconductor fin 30. The top surface of the shallow trench isolation layer 20 is recessed with respect to the top surfaces of the at least one semiconductor fin 30.

Optionally, doped wells (not shown) may be formed in an upper portion of the semiconductor material layer 10 and underneath at least one semiconductor fin 30 as needed. Optionally, a punchthrough doping layer having a doping of the opposite conductivity type as the at least one semiconductor fin 30 may be provided at a lower portion of the at least one semiconductor fin 30 or a portion of the semiconductor material layer 10 that underlies the at least one semiconductor fin 30. In general, various portions of the semiconductor material layer 10 and lower portions of the at least one semiconductor fin 30 may be doped to provide suitable electrical isolation among the at least one semiconductor fin 30.

Figure 3A:
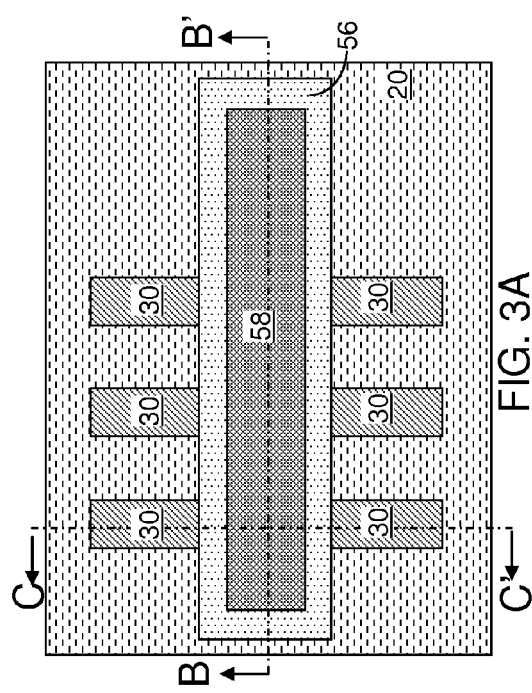
FIG. 3A is a top-down view of the exemplary semiconductor structure after formation of a disposable gate structure and a gate spacer according to an embodiment of the present disclosure.
Figure 3C:
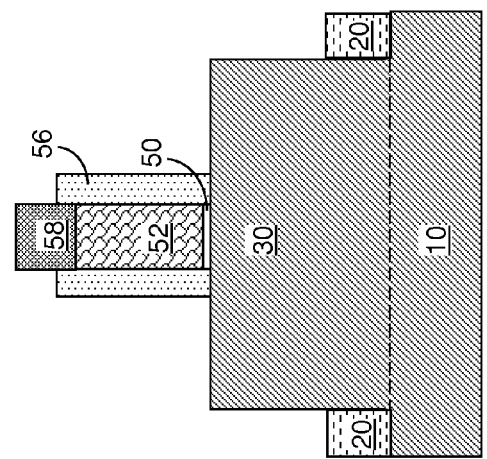
FIG. 3C is a vertical cross-sectional view of the exemplary structure along the vertical plane C-C' in FIG. 3A.
Figure 3B:
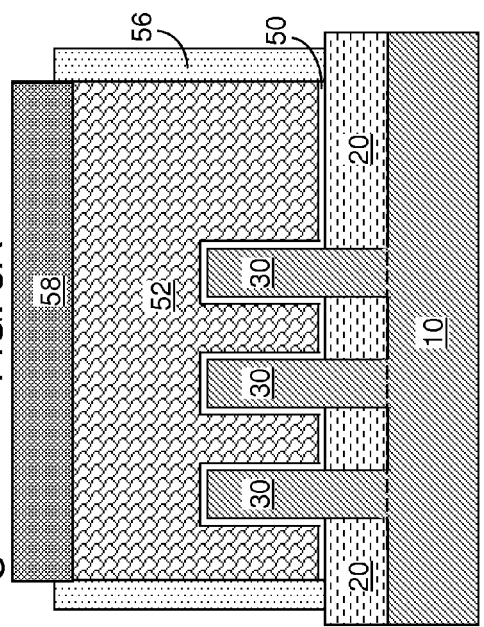
FIG. 3B is a vertical cross-sectional view of the exemplary structure along the vertical plane B-B' in FIG. 3A.

Referring to FIGS. 3A-3C, a disposable gate structure (50, 52, 58) can be formed across the at least one semiconductor fin 30. The disposable gate structure (50, 52, 58) can be a disposable gate structure that includes at least one disposable material, i.e., at least one material that are subsequently removed. For example, the disposable gate structure (50, 52, 58) can include a lower disposable gate material portion 50 including a first dielectric material, a middle disposable gate material portion 52 including a disposable semiconductor material, and an upper disposable gate material portion 58 including a second disposable dielectric material. In an illustrative example, the lower disposable gate material portions 50 can include silicon oxide, the middle disposable gate material portions 52 can include germanium or a germanium-containing alloy that can be removed selective to the semiconductor materials of the at least one semiconductor fin 30, and the upper disposable gate material portion 58 can include silicon nitride. The disposable gate structure (50, 52, 58) can be formed by deposition of disposable material layers, application and lithographic patterning of a photoresist layer above the disposable material layers, and transfer of the pattern in the patterned photoresist layer through the disposable material layers by an anisotropic etch such as a reactive ion etch. The remaining portions of the disposable material layers constitute the disposable gate structure (50, 52, 58). The patterned photoresist layer can be removed, for example, by ashing. While an embodiment employing a replacement gate scheme is employed to illustrate the processing steps of the present disclosure, a gate-first integration scheme that does not employ a replacement gate can also be employed to practice the methods of the present disclosure.

A gate spacer 56 can be formed by depositing a gate spacer layer and anisotropically etching the gate spacer layer. The gate spacer layer can be formed on the top surfaces and sidewalls of the gate structures (50, 52, 58) and the at least one semiconductor fin 30 by a conformal deposition of a dielectric material. The gate spacer layer can be formed, for example, by low pressure chemical vapor deposition (LPCVD), atomic layer deposition (ALD), or any other conformal deposition method for depositing a dielectric material as known in the art. In one embodiment, the gate spacer layer can include silicon nitride. The dielectric material of the gate spacer layer can be silicon oxide, silicon nitride, silicon oxynitride, organosilicate glass, a dielectric metal oxide, a dielectric metal nitride, or a combination thereof. The thickness of the gate spacer layer can be in a range from 3 nm to 60 nm, although lesser and greater thicknesses can also be employed.

An anisotropic etch is performed to remove horizontal portions of the gate spacer layer. The anisotropic etch can be selective to the semiconductor material of the at least one semiconductor fin 30. The anisotropic etch is extended further after removal of horizontal portions of the gate spacer layer so that all vertical portions of the gate spacer layer are removed from the sidewalls of the at least one semiconductor fin 30. Remaining vertical portions of the gate spacer layer located on the gate structure (50, 52, 58) constitute the gate spacer 56.

Referring to FIGS. 4A-4C, raised active regions (4S, 4D) are formed on physically exposed semiconductor surfaces of the at least one semiconductor fin 30 by selective deposition of a semiconductor material. The raised active regions (4S, 4D) can include a raised source region 4S and a raised drain region 4D. In one embodiment, the selective deposition of the semiconductor material can be performed by a selective epitaxy process. During the selective epitaxy process, the deposited semiconductor material grows from physically exposed semiconductor surfaces, i.e., the physically exposed portions of the lengthwise sidewalls and top surfaces of the at least one semiconductor fin 30, while the semiconductor material is not deposited on, and thus, does not grow from, dielectric surfaces such as the outer sidewalls of the gate spacer 56, the topmost surface of the gate stack (50, 52, 58), and the top surface of the shallow trench isolation layer 20.

As used herein, a "raised active region" refers to an active region (i.e., a source region or a drain region) that is located on, and outside, a semiconductor fin or a preexisting semiconductor material portion. In one embodiment, each portion of the raised active regions (4S, 4D) can be epitaxially aligned to an underlying semiconductor fin 30. The raised active regions (4S, 4D) can include the same semiconductor material as, or a semiconductor material different from, the semiconductor material of the at least one semiconductor fin 30.

The growth of the raised active regions (4S, 4D) can proceed with, or without, crystallographically faceted surfaces depending on the deposited semiconductor material and the deposition conditions. In one embodiment, the various semiconductor material portions of the raised active regions (4S, 4D) can be formed with crystallographic facets. The crystallographic facets of the raised active regions (4S, 4D) can be at a non-zero, non-orthogonal, angle with respect to adjoining surfaces of the raised active regions (4S, 4D).

In one embodiment, the at least one semiconductor fin 30 can include a plurality of semiconductor fins and the selective epitaxy process can proceed until multiple raised active regions (4S, 4D) from neighboring semiconductor fins 30 merge. Within each merged raised active region (4S or 4D), grain boundaries can be formed at the interface at which neighboring single crystalline semiconductor material portions contact each other. The selective epitaxy process can be terminated when the sizes of the raised active regions (4S, 4D) reach a predetermined target, for example, by controlling the deposition conditions and the deposition time.

In one embodiment, the raised active regions (4S, 4D) can be formed with in-situ doping during the selective epitaxy process. Thus, each portion of the raised active regions (4S, 4D) can be formed as doped semiconductor material portions. Alternatively, the raised active regions (4S, 4D) can be formed by ex-situ doping. In this case, the raised active regions (4S, 4D) can be formed as intrinsic semiconductor material portions and electrical dopants can be subsequently introduced into the raised active regions (4S, 4D) to convert the raised active regions (4S, 4D) into doped semiconductor material portions.

If ex-situ doping is employed, ion implantation can provide electrical doping to portions of the at least one semiconductor fin 30 that do not underlie the gate structures (50, 52, 58). The implanted portions of the at least one semiconductor fin 30 are converted into fin active regions (3S, 3D). The fin active regions (3S, 3D) can include at least one fin source region 3S and at least one fin drain region 3D. As used herein, an "active region" can be a source region or a drain region of a field effect transistor. As used herein, a "fin active region" refers to an active region located within a semiconductor fin. As used herein, a "fin source region" refers to a source region located within a semiconductor fin. As used herein, a "fin drain region" refers to a drain region located within a semiconductor fin.

If the at least one semiconductor fin 30 include electrical dopants of a first conductivity type, ions of a second conductivity type that is the opposite of the first conductivity type can be implanted to form the fin active regions (3S, 3D). For example, the first conductivity type can be p-type and the second conductivity type can be n-type, or vice versa.

If in-situ doping is employed, an anneal process can be performed to outdiffuse the electrical dopants from the raised active regions (4S, 4D) into underlying portions of the at least one semiconductor fin 30 to form fin active regions (3S, 3D).

The fin active regions (3S, 3D) can be formed by ion implantation concurrently with the ex-situ doping of the raised active regions (4S, 4D), by in-situ doping of raised active regions (4S, 4D) during the selective epitaxy process and outdiffusion of dopants from the raised active regions (4S, 4D) by an anneal, or a combination of ex-situ doping of the raised active regions (4S, 4D), in-situ doping of the raised active regions (4S, 4D) during the selective epitaxy process, and outdiffusion of dopants from the raised active regions (4S, 4D) by an anneal.

After formation of the fin active regions (3S, 3D), each portion of the at least one semiconductor fin 30 having a doping of the first conductivity type constitutes a body region 3B. A p-n junction can be formed at the interfaces between each adjoining pair of a body region 3B and a fin active region (3S or 3D).

Referring to FIGS. 5A-5C, a planarization dielectric layer 60 can be formed over the at least one semiconductor fin (3S, 3D, 3B), the raised active regions (4S, 4D), the disposable gate structure (50, 52, 58), and the shallow trench isolation layer 20. The planarization dielectric layer 60 includes a dielectric material that is self-planarizing or can be planarized, for example, by chemical mechanical planarization. The planarization dielectric layer 60 can include a dielectric material such as silicon oxide, silicon nitride, silicon oxynitride, or a combination thereof. In one embodiment, the planarization dielectric layer 60 can be deposited by chemical vapor deposition. The top surface of the contact level dielectric layer 80 can be planar, and can be located at, or above, the horizontal plane including the topmost surface of the disposable gate structure (50, 52, 58). In one embodiment, a topmost portion of the disposable gate structure (50, 52, 58) can be eroded during chemical mechanical planarization, and the topmost surface of the remaining portion of the upper disposable gate material portion 58 can be coplanar with the top surface of the planarization dielectric layer 60. The planarization dielectric layer 60 can be in physical contact with the top surfaces and sidewalls of the raised active regions (4S, 4D) and the top surface of the shallow trench isolation layer 20.

Referring to FIGS. 6A-6C, the disposable gate structure (50, 52, 58) can be replaced with a structure including a conductive material portion. In one embodiment, the conductive material portion can be a gate electrode of a field effect transistor, and the structure including the conductive material portion can be a gate structure (70, 72), which is herein referred to as a replacement gate structure. Specifically, the disposable gate structure (50, 52, 58) can be removed selective to the dielectric materials of the planarization dielectric layer 60 and the gate spacer 56 and the semiconductor material of the at least one semiconductor fin (3S, 3D, 3B) to form a gate cavity by employing a combination of etch processes. Subsequently, a gate dielectric 70 and a gate electrode 72 are formed within the gate cavity by deposition of a dielectric material and at least one conductive material, and removal of excess portions of the dielectric material and the at least one conductive material from above the top surface of the planarization dielectric layer 60. The gate dielectric 70 can include a high dielectric constant (high-k) dielectric material known in the art. The gate electrode 72 can include a doped semiconductor material and/or a metallic material. The top surfaces of the gate structure (70, 72) can be coplanar with the top surface of the planarization dielectric layer 60.

Referring to FIGS. 7A-7C, a contact level dielectric layer 80 is deposited over the top surface of the gate structure (70, 72) and the planarization dielectric layer 60. The contact level dielectric layer 80 includes a dielectric material that is deposited by chemical vapor deposition or spin coating. The contact level dielectric layer 80 can include a dielectric material such as silicon oxide, silicon nitride, silicon oxynitride, porous or non-porous organosilicate glass (OSG), or a combination thereof. In one embodiment, the top surface of the contact level dielectric layer 80 can be horizontal, and the thickness of the contact level dielectric layer 80 can be uniform throughout the entirety thereof. The thickness of the contact level dielectric layer 80 can be in a range from 50 nm to 500 nm, although lesser and greater thicknesses can also be employed.

Figure 8A:
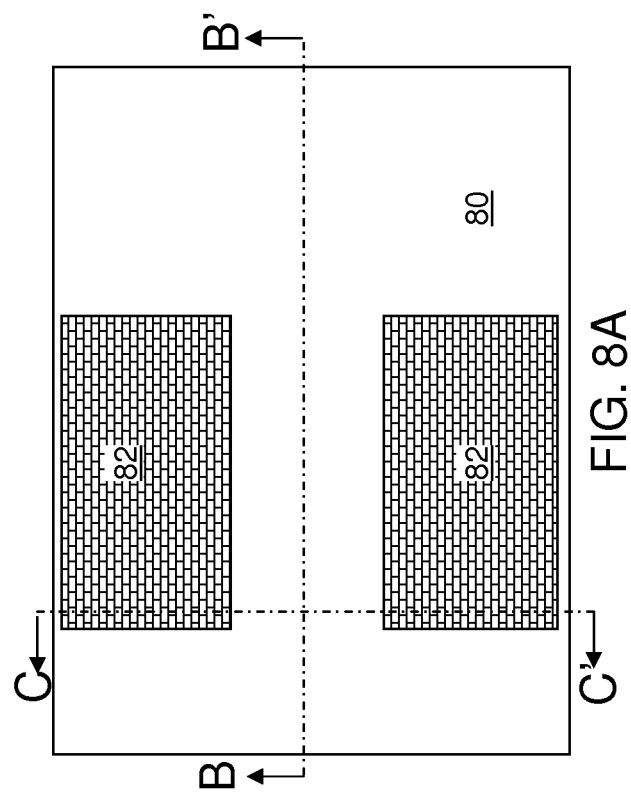
FIG. 8A is a top-down view of the exemplary semiconductor structure after formation of active region contact via structures according to an embodiment of the present disclosure.

Referring to FIGS. 8A-8C, first contact via structures can be formed at least through the contact level dielectric layer 80. The first contact via structures can be electrically shorted to at least one doped semiconductor region. In one embodiment, the first contact via structures can be active region contact via structures 82 that are formed through the contact level dielectric layer 80 and the planarization dielectric layer 60, and the at least one doped semiconductor region can include the at least one fin source region 3S and the at least one fin drain region 3D. The active region contact via structures 82 can include a source contact via structure that contacts the raised source region 4S (or the fin source region 3S if a raised source region is not formed) and a drain contact via structure that contacts the raised drain region 4S (or the fin drain region 3D if a raised drain region is not formed).

The first contact via structures can be formed, for example, by applying a photoresist layer over the contact level dielectric layer 80, lithographically patterning the photoresist layer to form opening therein, anisotropically etching the portions of the contact level dielectric layer 80 and the planarization dielectric layer 60 to form cavities through the contact level dielectric layer 80 and the planarization dielectric layer 60, removing the patterned photoresist layer, filling the cavities with at least one conductive material, and removing excess portions of the at least one conductive material from above the top surface of the contact level dielectric layer 80, for example, by chemical mechanical planarization. The anisotropic etch process employed to form the cavities can be selective to the semiconductor material of the raised active regions (4S, 4D), or the semiconductor material of the fin active regions (3S, 3D) if raised active regions are not formed. The photoresist layer is employed as the etch mask during the anisotropic etch process. Each remaining portion of the at least one conductive material that fill a cavity constitutes a first contact via structure, which can be an active region contact via structure 82.

In one embodiment, each cavity can be filled with a sacrificial material that can be subsequently removed selective to the contact level dielectric layer 80, the planarization dielectric layer 60, and the semiconductor material of the raised active regions (4S, 4D) or the semiconductor material of the fin active regions (3S, 3D) (if raised active regions are not formed). Such sacrificial material may include amorphous or polycrystalline SiGe, amorphous carbon, or other suitable materials. In this case a sacrificial via structure (not shown) can be formed in the place of each contact via structure 82 at this processing step, and the sacrificial via structures can be replaced with contact via structures 82 at a later processing step.

Figure 9B:
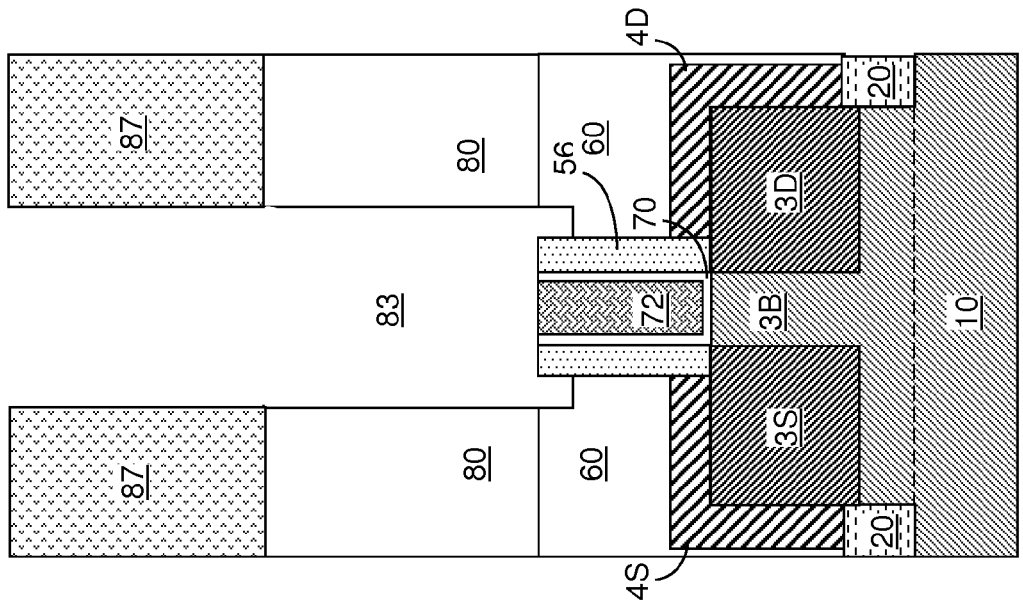
FIG. 9B is a vertical cross-sectional view of the exemplary structure along the vertical plane B-B' in FIG. 9A.
Figure 9A:
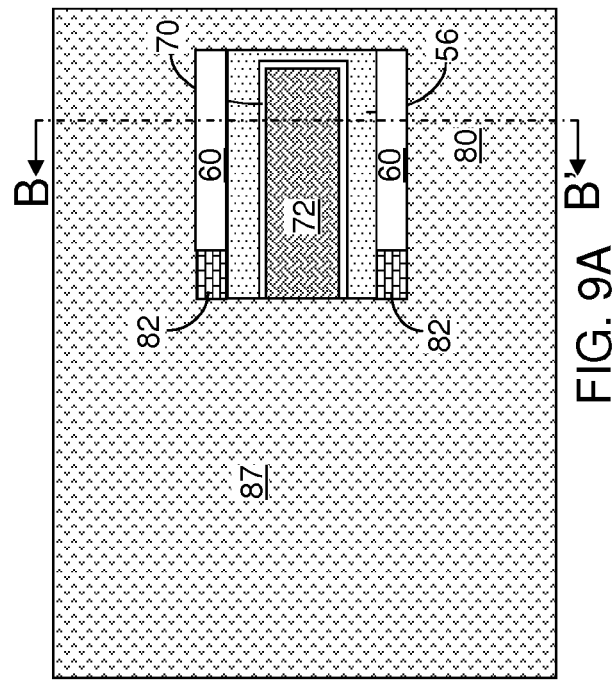
FIG. 9A is a top-down view of the exemplary semiconductor structure after formation of a gate contact cavity according to an embodiment of the present disclosure.

Referring to FIGS. 9A and 9B, at least one cavity can be formed through the contact level dielectric layer 80. In one embodiment, the at least one cavity can include a gate contact cavity 83 that is formed in an area overlying at least a portion of the gate electrode 72.

In one embodiment, a patterned photoresist layer 87 can be formed over at least one dielectric material layer, which can include the planarization dielectric layer 60 and the contact level dielectric layer 80. The patterned photoresist layer 87 includes at least one opening therein. An opening in the patterned photoresist layer 87 is formed in an area overlying a portion of the gate electrode 72 and including portions of a top surface of one or more first contact via structure such as the active region contact via structures 82. In one embodiment, a portion of a top surface of at least one first contact via structure (such as the active region contact via structures 82) can be physically exposed within the opening in the photoresist layer 87.

The portion of the topmost surface of the at least one dielectric material layer (60, 80) within the area of the opening in the patterned photoresist layer 87 can be recessed by an anisotropic etch selective to the first contact via structure(s) (such as the active region contact via structures 82 (or the sacrificial via structures) employing the patterned photoresist layer 87 as an etch mask. The gate contact cavity 83 is formed in the volume from which the material(s) of the at least one dielectric material layer (60, 80) is removed.

In general, a cavity formed by the anisotropic etch (such as the gate contact cavity 83) at this process step can extend through the at least one dielectric material layer, and can overlie a conductive material portion such as the gate electrode 72. The top surface of the conductive material portion can be physically exposed within the trench. In one embodiment, at least one outer sidewall of at least one first contact via structure 82 (or the sacrificial via structure) can be physically exposed within the cavity that is formed at the process step. For example, at least one outer sidewall of at least one active region contact via structures 82 can be physically exposed within the gate contact cavity 83. In one embodiment, the bottommost surface of the cavity can be recessed below the top surface of the conductive material portion. For example, the bottommost surface of the gate contact cavity 83 can be recessed below the top surface of the gate electrode 72.

Figure 10B:
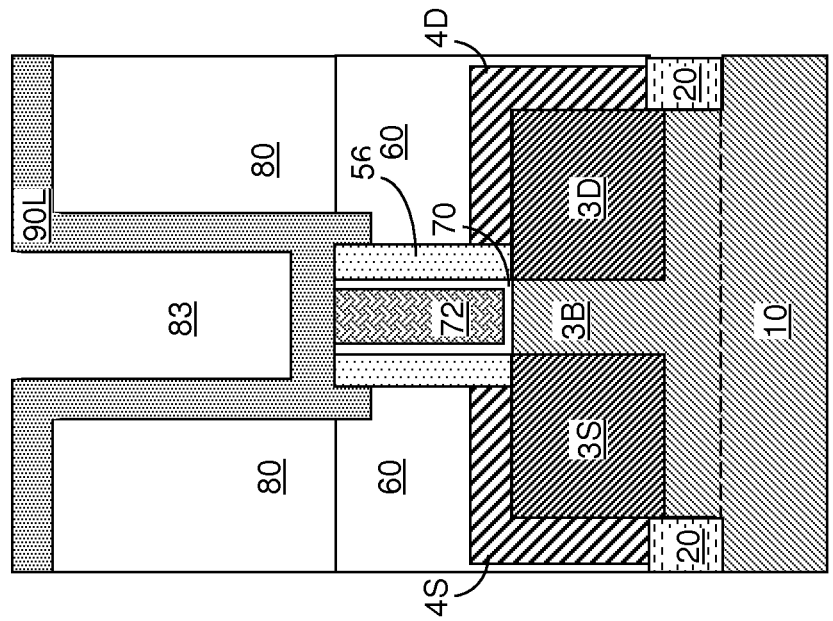
FIG. 10B is a vertical cross-sectional view of the exemplary structure along the vertical plane B-B' in FIG. 10A.
Figure 10A:
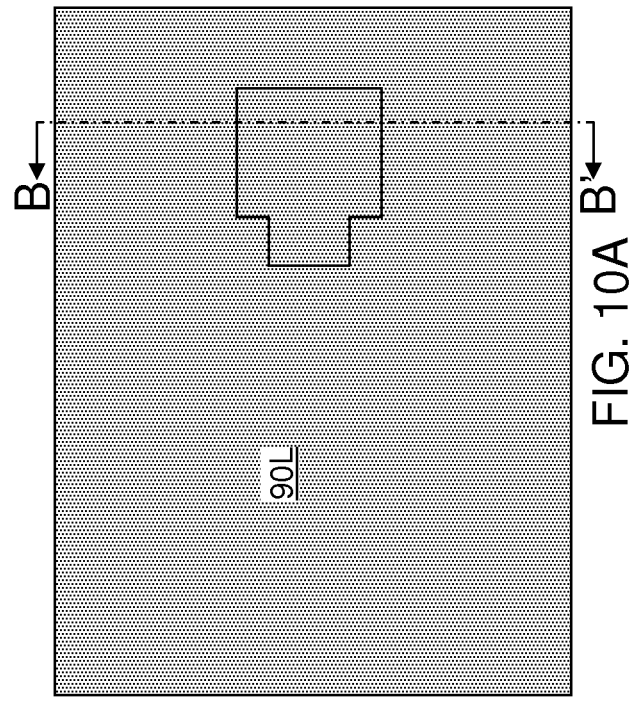
FIG. 10A is a top-down view of the exemplary semiconductor structure after formation of a dielectric liner according to an embodiment of the present disclosure.

Referring to FIGS. 10A and 10B, a dielectric liner 90L can be deposited on the sidewalls and bottom surfaces of each cavity including the gate contact cavity 83 and the top surface of the contact level dielectric layer 80. The dielectric liner 90L includes a dielectric material such as silicon nitride, silicon oxide, silicon oxynitride, a dielectric metal oxide, or a non-porous nitrogen-doped organosilicate glass (OSG). In one embodiment, the dielectric liner 90L can include silicon nitride or a dielectric metal oxide.

In one embodiment, the dielectric liner 90L can be deposited by a conformal deposition method such as chemical vapor deposition or atomic layer deposition. The thickness of the dielectric liner 90L can be in a range from 3 nm to 50 nm, although lesser and greater thicknesses can also be employed.

Figure 11A:
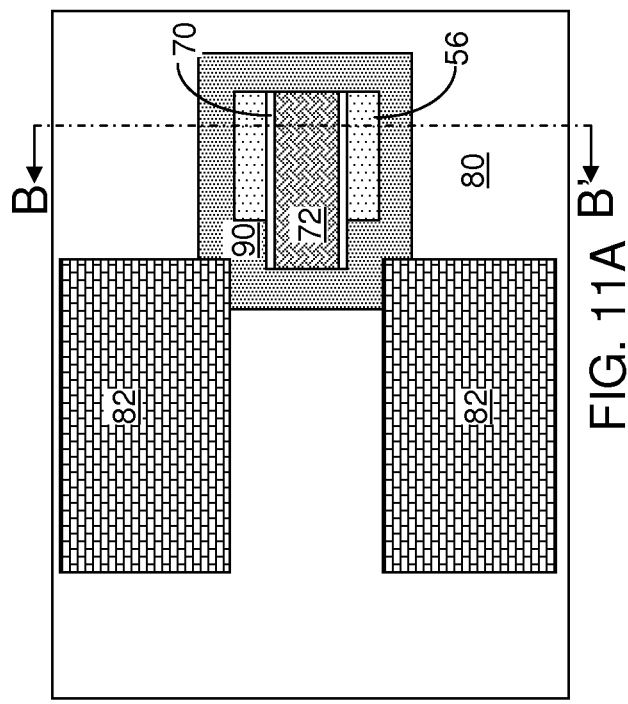
FIG. 11A is a top-down view of the exemplary semiconductor structure after formation of a dielectric spacer according to an embodiment of the present disclosure.
Figure 11B:
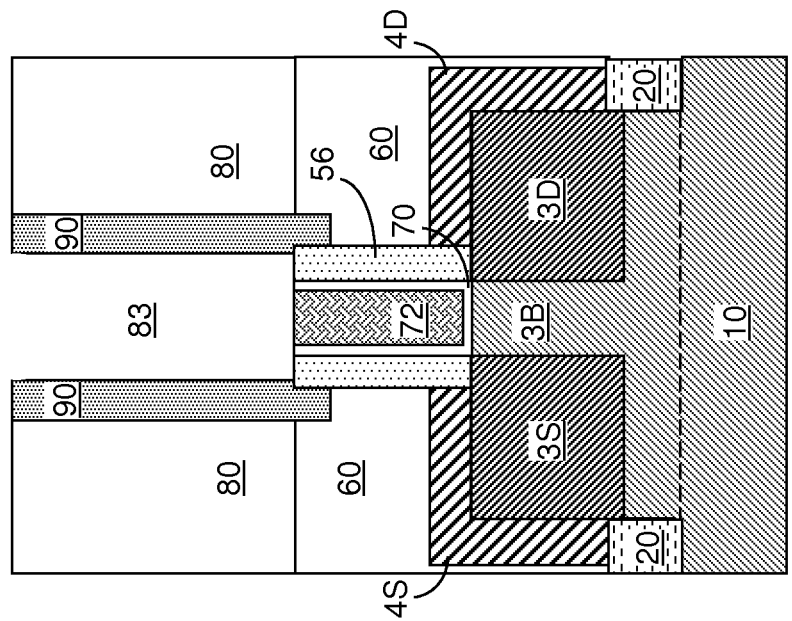
FIG. 11B is a vertical cross-sectional view of the exemplary structure along the vertical plane B-B' in FIG. 11A.

Referring to FIGS. 11A and 11B, the dielectric liner 90L is anisotropically etched to form a dielectric spacer 90 on sidewalls of each cavity within the at least one dielectric material layer (60, 80). During the anisotropic etch, horizontal portions of the dielectric liner 90L are removed. Each remaining portion of the dielectric liner 90L constitutes a dielectric spacer 90. In one embodiment, a dielectric spacer 90 can be homeomorphic to a torus, i.e., has a shape that can be continuously stretched into a torus without forming, or destroying, a hole therein. The anisotropic etch can be selective to the dielectric material of the contact level dielectric layer 80 and/or to the materials of the gate structure (70, 72). In one embodiment, a dielectric spacer 90 can be formed directly on at least one outer sidewall of at least one first contact via structure. For example, the dielectric spacer 90 can be formed directly on at least one outer sidewall of the active region contact via structures 82. A top surface of a conductive material portion, such as the gate electrode 72, can be physically exposed within each cavity laterally surrounded by a dielectric spacer 90.

Figure 12A:
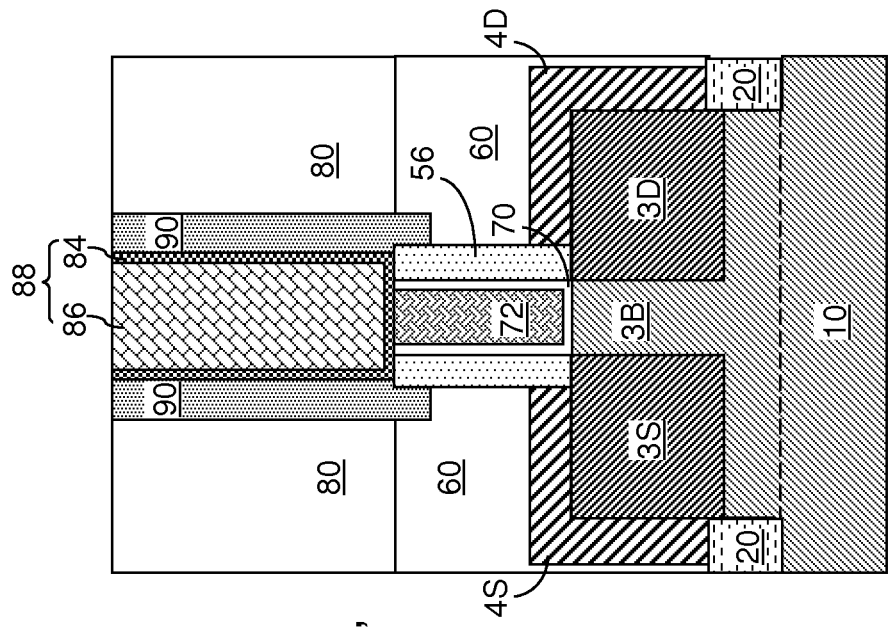
FIG. 12A is a top-down view of the exemplary semiconductor structure after formation of a gate contact via structure according to an embodiment of the present disclosure.
Figure 12B:
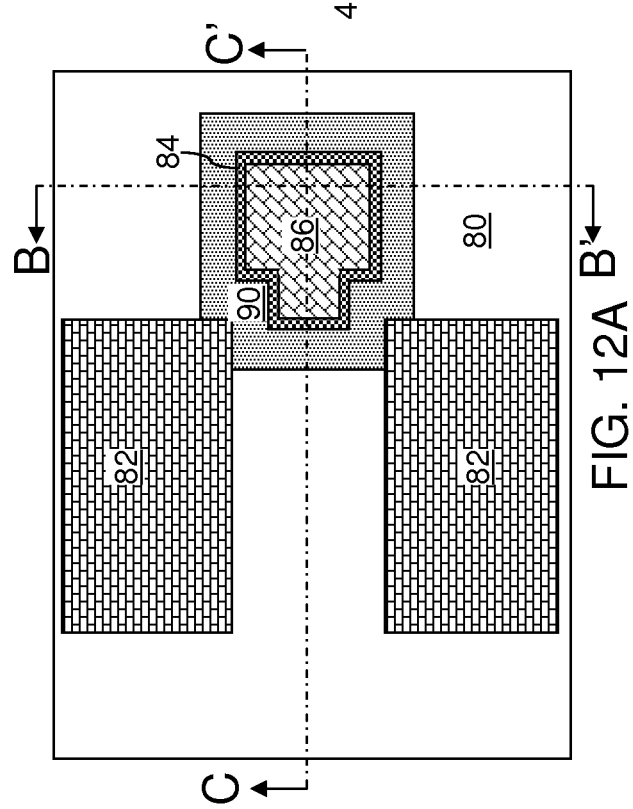
FIG. 12B is a vertical cross-sectional view of the exemplary structure along the vertical plane B-B' in FIG. 12A.
Figure 12C:
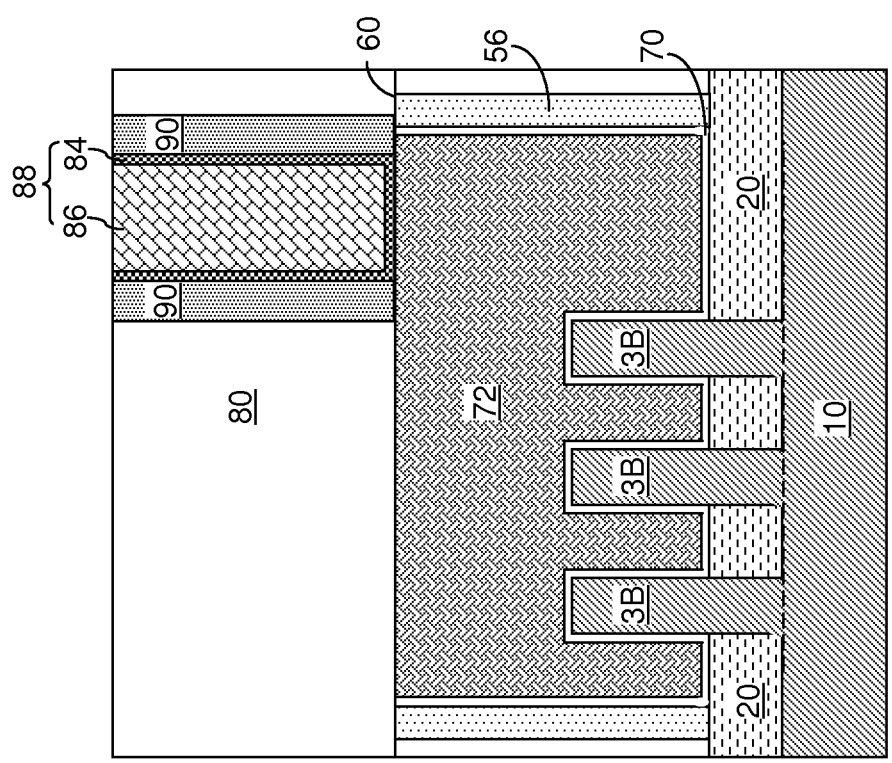
FIG. 12C is a vertical cross-sectional view of the exemplary structure along the vertical plane C-C' in FIG. 12A.

Referring to FIGS. 12A-12C, a second contact via structure can be formed within each cavity surrounded by a dielectric spacer 90. The second contact via structure can be formed by depositing at least one conductive material within each cavity surrounded by a dielectric spacer 90, and by removing excess portions of the at least one conductive material from above the horizontal plane including the top surface of the contact level dielectric layer 80.

Each second contact via structure can be formed in a cavity surrounded by a dielectric spacer 90. In this case, each second contact via structure can be formed directly on inner sidewalls of a dielectric spacer 90 and directly on a top surface of a conductive material portion. Within each cavity surrounded by a dielectric spacer 90, a second contact via structure can be formed by depositing at least one conductive material directly on the top surface of the underlying conductive material portion and inner sidewalls of the dielectric spacer. Further, the at least one conductive material can be deposited over the at least one dielectric material layer (60, 80). In one embodiment, the at least one conductive material can include a metallic liner material such as TiN, TaN, WN, TiC, TaC, WC, or a combination thereof and a metallic fill material such as Cu, W, Al, or alloys thereof. The at least one conductive material can be removed from above the horizontal plane including the top surface of the at least one dielectric material layer (60, 80). Each remaining portion of the at least one conductive material can constitute a second conductive via structure.

In one embodiment, the second contact via structure can be a gate contact via structure 88 that fills a gate contact cavity 83. In one embodiment, the gate contact via structure 88 can include a metallic liner 84 and a metallic fill material portion 86. The metallic liner 84 can contact inner sidewall surfaces of a dielectric liner 90, a top surface of a gate electrode 72, a top surface of a gate dielectric 70 (which can be a U-shaped gate dielectric including a horizontal portion and vertical portions extending upward from edges of the horizontal portion), and optionally top surfaces of the gate spacer 56. The metallic fill material portion 86 can contact inner sidewalls and a top surface of the metallic liner 84, and can be spaced from the dielectric liner 90 by the vertical portions of the metallic liner 84.

In one embodiment, if sacrificial via structures are formed in lieu of the first contact via structures 82 at the processing steps of FIGS. 8A-8C, the sacrificial material can be removed selective to the contact level dielectric layer 80, the planarization dielectric layer 60, at least one fin source region 3S and the at least one fin drain region 3D, and the dielectric spacer 90 to form a cavity. This cavity and the cavity surrounded by dielectric spacer 90 are filled by depositing at least one conductive material and removing the excess portions of the at least one conductive material from above the horizontal plane including the top surface of the contact level dielectric layer 80 to form a first contact via structure and a second contact via structure.

The exemplary semiconductor structure includes a semiconductor material portion, such as a semiconductor fin (3S, 3D, 3B), that includes a doped semiconductor region, such as a fin source region 3S or a fin drain region 3D, and located on a substrate, such as a semiconductor material layer 10. The exemplary semiconductor structure further includes a conductive material portion, such as a gate electrode 72, that is located above, and electrically insulated from, the semiconductor material portion. The exemplary semiconductor structure further includes at least one dielectric material layer (60, 80) overlying the semiconductor material portion, and a first contact via structure, such as an active region contact via structure 82, that extends through, and contacts, the at least one dielectric material layer (60, 80) and electrically shorted to the doped semiconductor region. In addition, the exemplary semiconductor structure includes a second contact via structure, such as the gate contact via structure 88, that extends through the at least one dielectric material layer (60, 80) and is electrically shorted to the conductive material portion, and a dielectric spacer 90 laterally surrounding the second contact via structure. Inner sidewalls of the dielectric spacer 90 contact all sidewalls of the second contact via structure. In one embodiment, the first contact via structure can extends further downward from the top surface of the at least one dielectric material layer (60, 80) than the second contact via structure.

Outer sidewalls of the dielectric spacer 90 contact a sidewall of the first contact via structure. The outer sidewalls of the dielectric spacer 90 further contact sidewalls of the at least one dielectric material layer (60, 80). In one embodiment, the topmost surface of the dielectric spacer 90 can be coplanar with the topmost surface of the at least one dielectric material layer (60, 80). In one embodiment, the dielectric spacer 90 can have a uniform lateral thickness throughout due to use of a conformal material layer for the dielectric liner 90L.

In one embodiment, a bottom surface of the dielectric spacer 90 can be in contact with a top surface of the conductive material portion such as the top surface of the gate electrode 72. In one embodiment, another bottom surface of the dielectric spacer 90 can be recessed below the horizontal plane including the top surface of the conductive material portion, e.g., the top surface of the gate electrode 72.

In one embodiment, the conductive material portion can be a gate electrode 72 of a field effect transistor, and the doped semiconductor region can be an active region (3S, 3D) of the field effect transistor. A gate spacer 56 can laterally surround the gate electrode 72, and the dielectric spacer 90 can contact the gate spacer 56.

Referring to FIGS. 13A and 13B, a variation of the exemplary semiconductor structure can be derived from the exemplary semiconductor structure by employing a semiconductor-on-insulator (SOI) substrate including a handle substrate 10, a buried insulator layer 120, and a top semiconductor layer, and by forming at least one semiconductor fin by patterning the top semiconductor layer. In this case, formation of a shallow trench isolation layer can be omitted. Other processing steps employed to form the exemplary semiconductor structure can be employed to provide the variation of the exemplary semiconductor structure illustrated in FIGS. 13A and 13B.

The methods of the present disclosure can be employed to form a semiconductor structure including a dielectric spacer 90 laterally surrounding one type of contact via structures to provide electrical isolation from another type of via structures not employing a dielectric spacer. Use of the dielectric spacer 90 enables electrical isolation of contact via structures extending to different depths from the top surface of at least one dielectric material layer (60, 80) in geometry employing tight overlay tolerances that would otherwise cause electrical shorts among contact via structures. Thus, the dielectric spacer 90 of the present disclosure can enable a tighter pitch contact via formation than methods of forming contact via structures as known in the art.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:
a semiconductor material portion including a doped semiconductor region and located on a substrate;
a conductive material portion located above, and electrically insulated from said semiconductor material portion;
at least one dielectric material layer overlying said semiconductor material portion and said conductive material portion;
a first contact via structure extending through, and contacting, said at least one dielectric material layer and electrically shorted to said doped semiconductor region;
a second contact via structure extending through said at least one dielectric material layer and electrically shorted to said conductive material portion; and
a dielectric spacer laterally surrounding said second contact via structure, wherein inner sidewalls of said dielectric spacer contact said sidewalls of said second contact via structure along an entire length of said sidewalls of said second contact via structure, and a bottom surface of said dielectric spacer is in contact with a top surface of said conductive material portion such that said dielectric spacer covers only an upper portion of lateral surfaces and said top surface of said conductive material portion.

2. The semiconductor structure of claim 1, wherein outer sidewalls of said dielectric spacer contact a sidewall of said first contact via structure.

3. The semiconductor structure of claim 2, wherein said outer sidewalls of said dielectric spacer further contacts sidewalls of said at least one dielectric material layer.

4. The semiconductor structure of claim 1, wherein a topmost surface of said dielectric spacer is coplanar with a topmost surface of said at least one dielectric material layer.

5. The semiconductor structure of claim 1, wherein said dielectric spacer has a uniform lateral thickness throughout.

6. The semiconductor structure of claim 1, wherein another bottom surface of said dielectric spacer is recessed below a horizontal plane including said top surface of said conductive material portion.

7. The semiconductor structure of claim 1, wherein said conductive material portion is a gate electrode of a field effect transistor, and said doped semiconductor region is an active region of said field effect transistor.

8. The semiconductor structure of claim 7, further comprising a gate spacer laterally surrounding said gate electrode, wherein said dielectric spacer contacts said gate spacer.

9. The semiconductor structure of claim 1, wherein said first contact via structure extends further downward from a top surface of said at least one dielectric material layer than said second contact via structure.

10. The semiconductor structure of claim 1, wherein said semiconductor material portion is a semiconductor fin.

11. The semiconductor structure of claim 10, wherein said substrate comprises a semiconductor layer, and said semiconductor material layer and said semiconductor fin comprise a same semiconductor material.

12. The semiconductor structure of claim 10, further comprising a shallow trench isolation layer located around bottom portions of said semiconductor fin.

13. The semiconductor structure of claim 10, further comprising a raised active source region located on a portion of said semiconductor fin, and a raised active drain region located on another portion of said semiconductor fin.

14. The semiconductor structure of claim 13, wherein said raised active source region and said raised active drain region are epitaxially aligned to said semiconductor fin.

15. The semiconductor structure of claim 1, wherein said conductive material portion is insulated from said semiconductor portion by a U-shaped gate dielectric layer.

* * * * *